United States Patent
Li et al.

(10) Patent No.: US 9,943,931 B2
(45) Date of Patent: Apr. 17, 2018

(54) HIGH PERFORMANCE TRANSIENT UNIFORM COOLING SOLUTION FOR THERMAL COMPRESSION BONDING PROCESS

(71) Applicant: Intel Corporation, Santa Clara, CA (US)

(72) Inventors: Zhihua Li, San Jose, CA (US); Hemanth K. Dhavaleswarapu, Chandler, AZ (US); Joseph B. Petrini, Gilbert, AZ (US); Shankar Devasenathipathy, Tempe, AZ (US); Steven B. Roach, Gilbert, AZ (US); Ioan Sauciuc, Phoenix, AZ (US); Pranav K. Desai, Chandler, AZ (US); George S. Kostiew, Queen Creek, AZ (US); Sanjoy K. Saha, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/221,102

(22) Filed: Jul. 27, 2016

(65) Prior Publication Data
US 2017/0014957 A1    Jan. 19, 2017

Related U.S. Application Data

(62) Division of application No. 13/992,439, filed as application No. PCT/US2011/066046 on Dec. 20, 2011, now Pat. No. 9,434,029.

(51) Int. Cl.
*B23K 37/00* (2006.01)
*B23K 3/08* (2006.01)
(Continued)

(52) U.S. Cl.
CPC ............ *B23K 37/003* (2013.01); *B23K 3/085* (2013.01); *B23K 20/023* (2013.01); *F25B 21/02* (2013.01);
(Continued)

(58) Field of Classification Search
CPC .... B23K 37/003; B23K 3/085; B23K 20/023; F25B 21/02; F25B 2321/0251;
(Continued)

(56) References Cited

U.S. PATENT DOCUMENTS 3,095,709 A * 7/1963 Demand ................. F25B 21/02
                                                 136/204
3,137,142 A * 6/1964 Venema .................. F25B 21/02
                                                 62/3.2
(Continued)

FOREIGN PATENT DOCUMENTS

JP          3381565 B2     3/2003
JP        2003-303856 A   10/2003

OTHER PUBLICATIONS

International Preliminary Report on Patentability and Written Opinion Received for PCT Patent Application No. PCT/US2011/066046, dated Jul. 3, 2014, 9 pages.
(Continued)

*Primary Examiner* — Kiley Stoner
(74) *Attorney, Agent, or Firm* — Green, Howard & Mughal LLP.

(57) ABSTRACT

Various embodiments of thermal compression bonding transient cooling solutions are described. Those embodiments include a an array of vertically separated micro channels coupled to a heater surface, wherein every outlet micro channel comprises two adjacent inlet micro channel, and wherein an inlet and outlet manifold are coupled to the array
(Continued)

of micro channels, and wherein the heater surface and the micro channels are coupled within the same block.

8 Claims, 10 Drawing Sheets

(51) Int. Cl.
*H01L 23/00* (2006.01)
*H05K 3/34* (2006.01)
*B23K 20/02* (2006.01)
*F25B 21/02* (2006.01)

(52) U.S. Cl.
CPC .............. *H01L 24/75* (2013.01); *H01L 24/81* (2013.01); *H01L 24/83* (2013.01); *H05K 3/34* (2013.01); *F25B 2321/0251* (2013.01); *H01L 24/13* (2013.01); *H01L 24/29* (2013.01); *H01L 2224/131* (2013.01); *H01L 2224/291* (2013.01); *H01L 2224/75252* (2013.01); *H01L 2224/75301* (2013.01); *H01L 2224/75502* (2013.01); *H01L 2224/81203* (2013.01); *H01L 2224/83203* (2013.01)

(58) Field of Classification Search
CPC ........... H05K 3/34; H01L 24/83; H01L 24/81; H01L 24/75; H01L 2224/75502; H01L 2224/75301; H01L 24/13; H01L 24/29; H01L 2224/83203; H01L 2224/81203; H01L 2224/75252; H01L 2224/291; H01L 2224/131
USPC ................................................... 228/46, 200
See application file for complete search history.

(56) References Cited

U.S. PATENT DOCUMENTS

| | | | |
|---|---|---|---|
| 3,934,783 A | 1/1976 | Larrson | |
| 4,686,606 A * | 8/1987 | Yamada | H01L 23/3736 165/80.4 |
| 4,783,721 A | 11/1988 | Yamamoto et al. | |
| 4,879,632 A | 11/1989 | Yamamoto et al. | |
| 4,920,574 A | 4/1990 | Yamamoto et al. | |
| 5,390,844 A | 2/1995 | Distefano et al. | |
| 5,541,015 A | 7/1996 | Tajima et al. | |
| 5,868,301 A | 2/1999 | Distefano et al. | |
| 6,019,165 A * | 2/2000 | Batchelder | F25B 21/02 165/104.33 |
| 6,031,216 A | 2/2000 | Singh et al. | |
| 6,446,442 B1 * | 9/2002 | Batchelor | F25B 21/02 62/259.2 |
| 6,538,885 B1 | 3/2003 | Azar | |
| 7,135,877 B2 | 11/2006 | Beaman et al. | |
| 2002/0003137 A1 | 1/2002 | Yokoyama et al. | |
| 2004/0206477 A1 | 10/2004 | Kenny et al. | |
| 2005/0103774 A1 | 5/2005 | Shi | |
| 2005/0204747 A1 * | 9/2005 | Atkinson | F25B 21/02 62/3.7 |
| 2005/0274120 A1 * | 12/2005 | Quisenberry | F28D 15/0233 62/3.7 |
| 2006/0207746 A1 | 9/2006 | Bhatti et al. | |
| 2006/0289987 A1 | 12/2006 | Chiu | |
| 2007/0023275 A1 | 2/2007 | Tanase et al. | |
| 2007/0034356 A1 * | 2/2007 | Kenny | F04B 17/00 165/80.4 |
| 2007/0093079 A1 | 4/2007 | Aruga et al. | |
| 2008/0173342 A1 * | 7/2008 | Bell | F02G 1/043 136/201 |
| 2008/0197172 A1 | 8/2008 | Reiber | |
| 2008/0210383 A1 | 9/2008 | Hirata | |
| 2008/0245472 A1 | 10/2008 | Hirata et al. | |
| 2011/0085299 A1 | 4/2011 | Mizunaga et al. | |
| 2011/0197598 A1 * | 8/2011 | Cheng | H01L 23/3675 62/3.6 |
| 2011/0304987 A1 | 12/2011 | Oprins et al. | |
| 2012/0088362 A1 | 4/2012 | Hwang et al. | |
| 2012/0247664 A1 | 10/2012 | Kobayashi | |
| 2013/0032270 A1 | 2/2013 | Mawatari | |
| 2013/0227966 A1 * | 9/2013 | Ayres | F25B 21/02 62/3.2 |
| 2013/0240115 A1 | 9/2013 | Horng | |
| 2014/0376148 A1 | 12/2014 | Sasaki et al. | |
| 2015/0008254 A1 | 1/2015 | Wasserman et al. | |
| 2015/0129135 A1 | 5/2015 | Lee et al. | |
| 2015/0155210 A1 | 6/2015 | Lee et al. | |
| 2015/0171047 A1 | 6/2015 | Malatkar et al. | |
| 2015/0173209 A1 | 6/2015 | Dhavaleswarapu et al. | |

OTHER PUBLICATIONS

International Search Report and Written Opinion received for PCT Patent Application No. PCT/US2011/066046, dated Aug. 9, 2012, 14 pages.

* cited by examiner

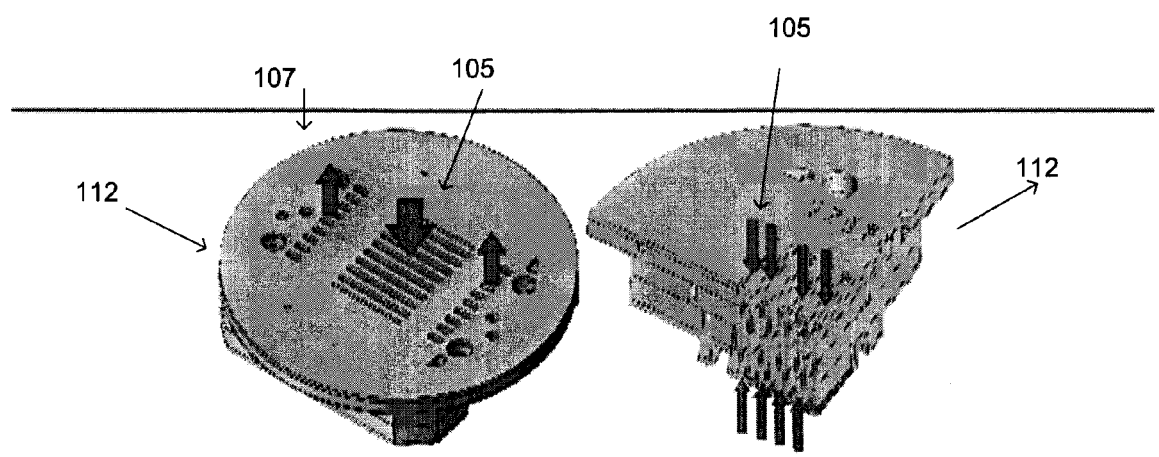
FIG. 1b
FIG. 1c
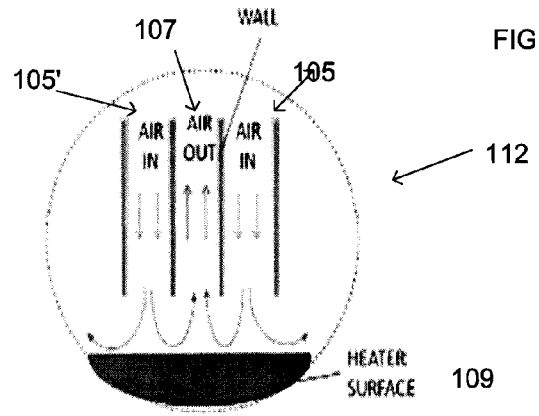
FIG. 1d

Top view

HIGH PERFORMANCE TRANSIENT UNIFORM COOLING SOLUTION FOR THERMAL COMPRESSION BONDING PROCESS

RELATED APPLICATIONS

The present application is a divisional of U.S. patent application Ser. No. 13/992,439, filed on Jun. 7, 2013, entitled "HIGH PERFORMANCE TRANSIENT UNIFORM COOLING SOLUTION FOR THERMAL COMPRESSION BONDING PROCESS", which claims priority under 35 U.S.C. 371 from International Application No. PCT/US2011/066046, filed on Dec. 12, 2011, entitled "HIGH PERFORMANCE TRANSIENT UNIFORM COOLING SOLUTION FOR THERMAL COMPRESSION BONDING PROCESS", which is hereby incorporated herein by reference in its entirety and for all purposes.

BACKGROUND OF THE INVENTION

Thermal compression bonding is being used in the microelectronic industry for finer control of first level interconnect (FLI) formation. In thermal compression bonding, a microelectronic die is first heated up until the solder is melted and a solder joint is formed. The die is then cooled down until the solder is solidified. The process time is determined by both the heating time and the cooling time. It is critical to cool the solder joint in the FLI region quickly and uniformly to reduce the process time, and to guarantee the quality of the solder joint.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
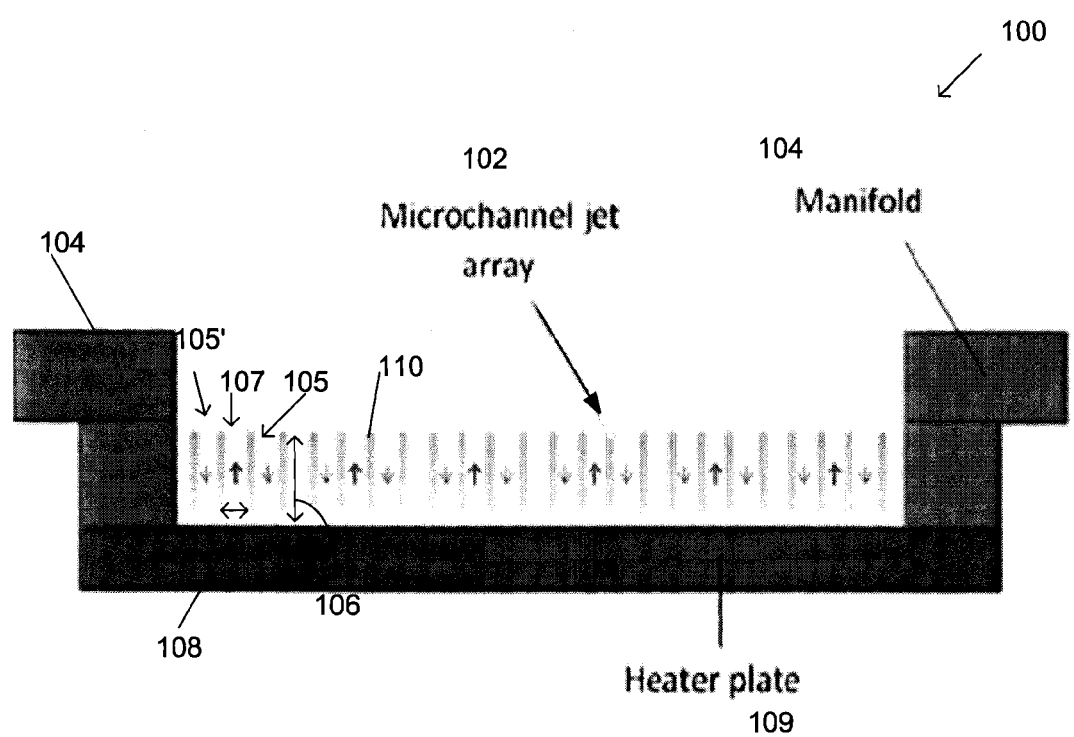
FIGS. 1a-1n represent structures according to various embodiments.

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled.

In the drawings, like numerals refer to the same or similar functionality throughout the several views.

Embodiments of transient cooling block or assembly structures and methods of utilizing such structures are described. Those assemblies and methods may include structures and methods of actively cooling a die during such processes as chip attach, die bonding, and similar die processes wherein a die may be cooled. The embodiments herein enable direct air impingement cooling which in turn enables high cooling rate of die and high heat transfer coefficient, for example, by utilizing micro jets/micro-channel structures during Thermal Compression Bonding (TCB) processes, in some embodiments.

Figure 2A:
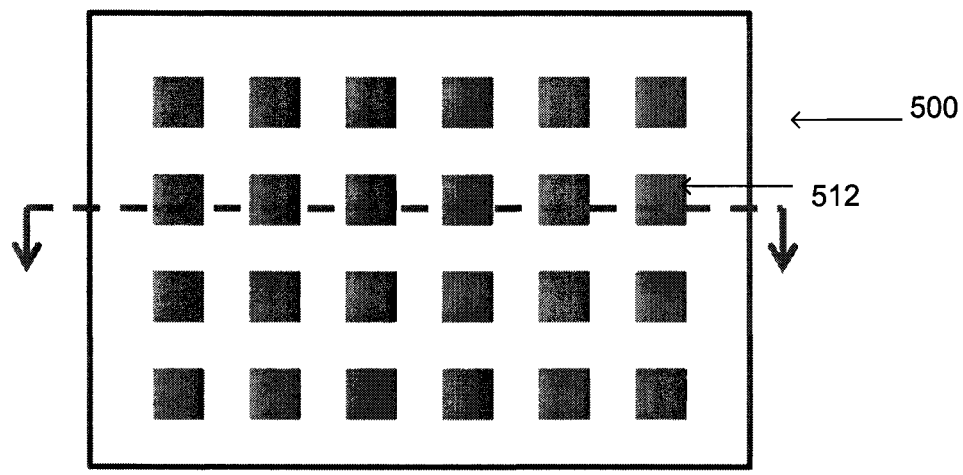
FIGS. 2a-2b represents structures according to the Prior Art.
Figure 2B:
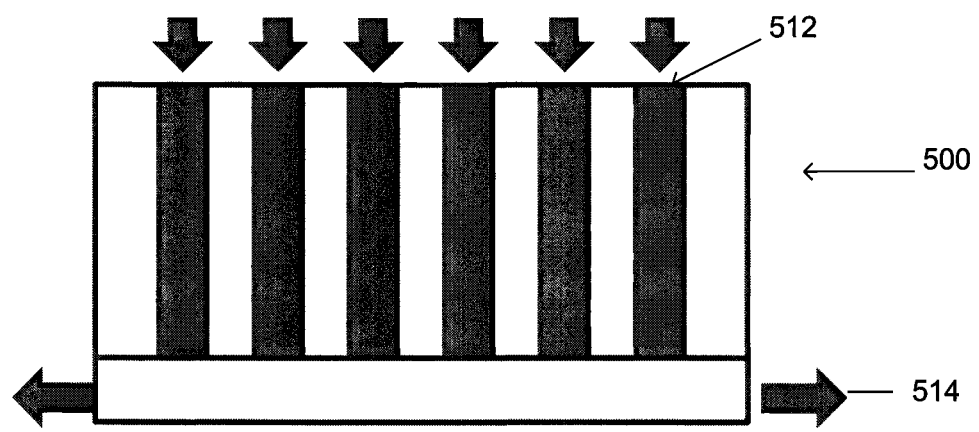

FIGS. 2a-2b depict a plain jet cooling design 200 from the Prior Art. In the Prior Art cooling head 200 (FIG. 2a, top view), multiple jets 212 can be used, wherein the flow exits from the side of the cooling head (FIG. 2b). However, the heat transfer coefficient is typically very low in such prior art systems because of the jet 212 interactions.

These jet interactions tend to block the hot air from centrally located jets from exiting to the ambient environment. Consequently, prior art TCB tools utilizing the head design 200 tend to take a long time to cool. This cooling rate requires the bonding process time to be long because the package can only be removed after the solder joint solidifies. Prior art designs such as design 200 may thus introduce a bottleneck for TCB processes that tend towards a higher cooling rate to reduce the time taken to bond each unit.

FIG. 1a shows the vertical cross section of an embodiment of a cooling solution, such as a direct air cooling solution 100. The cooling solution 100, which may comprise a portion of a TCB tool heater head design 100 in an embodiment, may comprise inlet/outlet manifolds 104 that may be coupled to a fluid source, a heater plate 109, and a micro channel jet array 102. Fluid that may flow through the array of micro channel jets 102 may impinge on the hot surface of the heater plate 109. In an embodiment, the manifolds 104 may provide passages for air inlet and outlet.

In an embodiment, a fluid, such as one of liquid and a compresses gas (i.e. air, helium, CO2, etc.) that may be incoming from two in coming micro channel jets 105, 105', may impinge on the hot surface of the heater plate 109, and then may pick up the heat from the heater plate 109. The heat may then be circulated away away/transferred into an adjacent outgoing micro jet channel 107, wherein the heat may later exit into the ambient environment, via the manifolds 104, in some cases. The fluid that is in contact with the heater plate 109, may travel only a few hundred microns before exiting into the ambient, since the dimensions of individual incoming micro channel jets 105, 105' and the outgoing micro channel jets 107 of the micro channel jet array 102 are on the order of microns in size, thus keeping the thermal boundary layer very thin. The heater surface is covered by small jets with the same high heat transfer coefficient. Therefore, the heater, the die and the solder joint in the first level interconnect region can be cooled uniformly and quickly. The transient process time can thus be significantly reduced.

In an embodiment, individual micro channel jets 105, 105', 107 may comprise a height 106 of about 200 microns or less, and a width 108 of about 10 microns or less although the height 106 and the width 108 may vary according to the particular application. In another embodiment, the width 108 may comprise about 20 microns or less. The height 106 and the width 108 may vary in a large range of size from a few microns to millimeters. In an embodiment, air may enter from the ambient environment from an intake slot and then enters individual inlet jetting holes 105 (FIG. 1j). In some embodiments, because each row of inlet jets may have an adjacent row of outlet jets 107, the air/fluid may then exit from the side of the cooling structure. Flow interations are therefore minimized. The jetting holes size can range from several microns to several millimeters. The gap height between the bottom of the cooling block to the hot surface is less than the size of the jet diameter, in an embodiment. In an embodiment, the number of micron sized micro channel jets in the array 102 (referring back to FIG. 1a) may be numerous, and may comprise hundreds to thousands of channel jets and may be arranged in a vertical orientation across the heater plate 109. Individual micro jets may comprise a wall 110 that may serve to separate the micro jets of the array 120 from each other. In an embodiment, a distance between individual vertically separated micro channels of the array 102 may comprise about 20 to about 200 microns.

The multiple jet impingement system of the cooling solution 100 removes the downside of boundary layer build up, thus enhancing the overall heat transfer of the system. In some embodiments, each inlet channel may have it's own adjacent outlet channel, however for other embodiments, every two incoming micro jets 105, 105' may have their own outlet micro jet 107 reducing the interaction between the micro channel jets and also providing for a nearly uniform heat transfer coefficient across the entire heater surface 109.

Maintaining such a small thermal boundary in the cooling assembly 100 maximizes the heat transfer coefficient to limits never seen before in prior art conventional air cooling assemblies. The performance of such a direct fluid cooling solution 100 quickly approaches the spreading resistance fundamental limit. In an embodiment, the cooling solution 100 can achieve a high heat transfer coefficient by using compressed air, for example, and may achieve cooling rates as high as 200 degrees Celsius per second. In an embodiment, the high Nusselt number of the cooling solution 100 may be in the laminar flow regime. In prior art TCB processes (which uses prior art cooling solutions), the corresponding heat transfer coefficient using air as a cooling fluid tends to be about 500 W/m2K. In some cases, the cooling solution 100 of the embodiments herein achieve a much shorter cooling time for solder, such as may be used in a microelectronic solder joint, by illustration and not limitation. In some cases, a minimum heat transfer coefficient achieved by the cooling solution 100 is about 3000 W/m2K.

FIGS. 1b and 1c depict a top view and cross sectional view of a portion of a cooling block 112 comprising micro channel jets, wherein inlet 105 and outlet jets 107 are depicted (please add further detail here if desired). FIG. 1d depicts an embodiment of a portion of the cooling block 112 wherein two inlet micro channel jets 105, 105' may receive fluid, such as air, which may impinge on the heater surface 109 and thus pick up the heat from the heater surface 109. In an embodiment, the air may comprise compressed air from a building facility supply. The fluid, which travels only a tens to hundred of microns, is then circulated away into the adjacent outlet micro channel jet 107 (thus avoiding interaction with surrounding jets) which then exits through the manifold 104 (not shown).

Figure 1E:
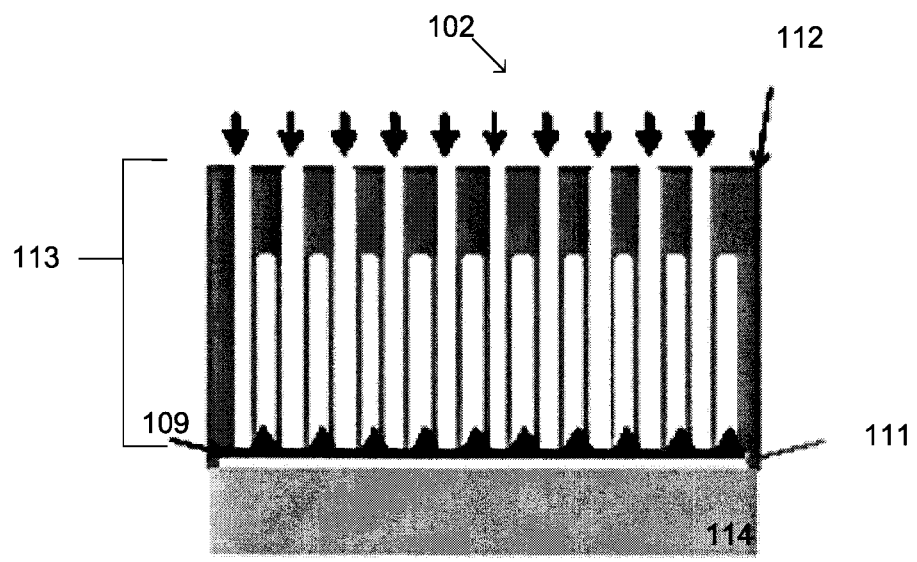

In an embodiment, the array of micro-channels 102 may be fabricated inside the cooling block 112 (FIG. 1e). Instead of mounting a cooling block on top of a heating block, as in prior art cooling solutions, the cooling block 112 is fabricated in the same material piece 113 in which the heater loops 109 are embedded. In an embodiment, there is a gap 111 disposed between the heater plate 109/cooling block 112 portion 113 and a nozzle 114 disposed beneath the heater/cooling block 113 and beneath the gap 111. In an embodiment, the gap 111, which may comprise an air gap 111 in some cases, may comprise a height of about 100 microns or less.

Figure 1F:
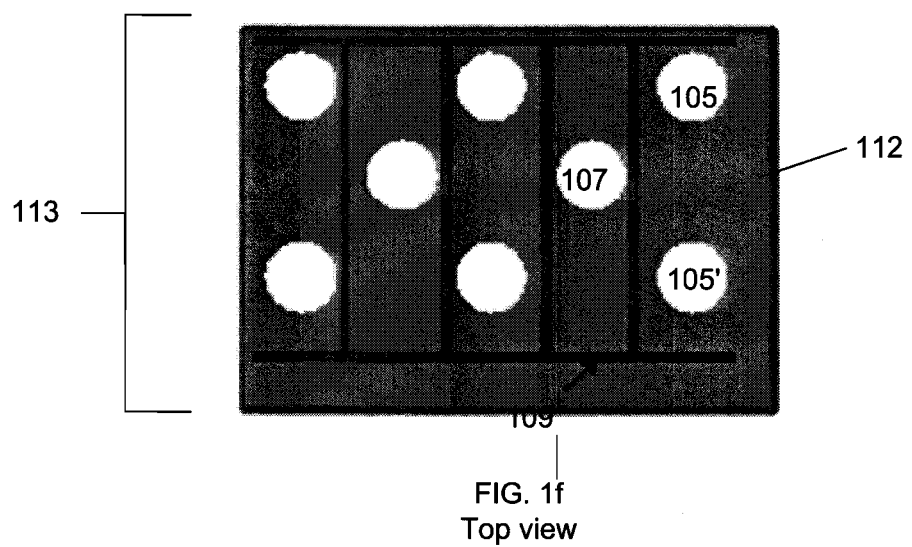

FIG. 1f shows a top view of the cooling assembly comprising the heater block/cooling block piece 113 from a top view, wherein the heater loops 109 are disposed within the same piece/block 113, and wherein the inlet 105, 105' and outlet 107 micro channel jets are disposed within the cooling/heater piece 113 as well.

Figure 1G:
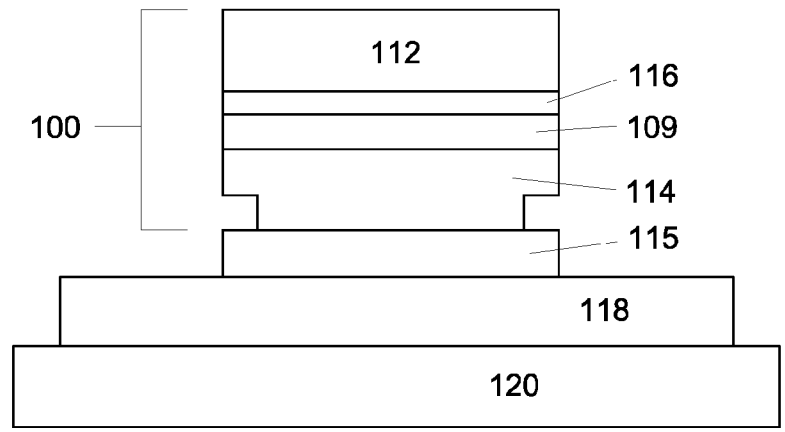

In another embodiment, a thermal electric cooling (TEC) element 116 is disposed between the cooling block 112 (including the inlet and outlet jets 105, 105', 107), and the heater 109, wherein the cooling solution further comprises a nozzle 114 disposed underneath the heater 109 (FIG. 1g). A backside of a die 115 (that is in thermal contact with the cooling solution 100) is disposed on a substrate 118, such as a package substrate 118 that is disposed on a pedestal 120, such as a TCB pedestal, for example. In an embodiment, the TEC 116 response time may be in the millisecond range, which enhances the cooling of the die 115 by the cooling solution 100. In an embodiment, the TEC 116 initially cools the die 115 from the bottom of the TEC 116 instantly, and then the TEC 116 removes the heat from the die 115 from the TEC 116 top surface.

Figure 1H:
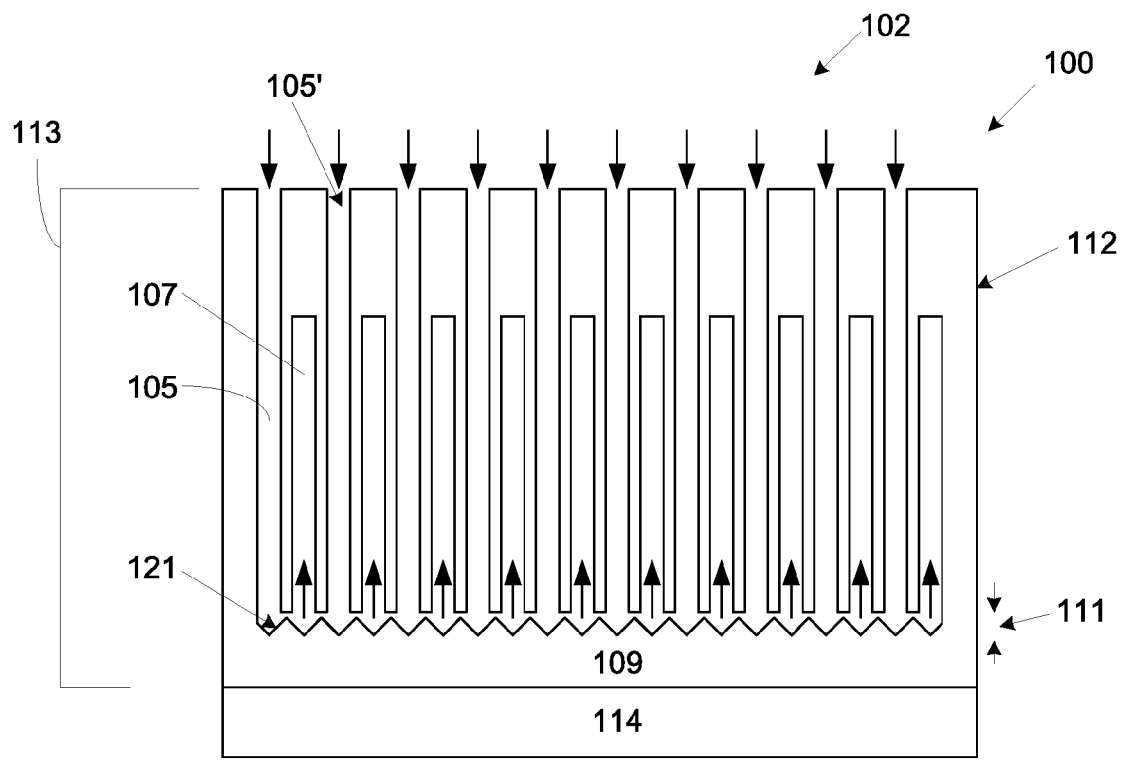

FIG. 1h depicts a portion of the cooling solution 100, comprising the array of micro channel jets 102 disposed in the cooling block 112, wherein the cooling block 112 and heater 109 are fabricated in the same piece of material 113. In an embodiment, the heater plate 109 further comprises a micro fin 121 design on a top surface of the heater 109. The micro fins 121 can be rectangular, triangular, pins or any other suitable shapes that can maximize the micro fin 121 effectiveness, according to the particular application. In an embodiment, the micro fin 121 tips may be aligned with a center region between adjacent inlet and outlet micro channel jets, such as between the inlet and outlet micro channel jets 105, 107. The micro fins 121 enhance the heat transfer by increasing the heat transfer surface area on the heater side.

In an embodiment, there may be a gap 111 between the cooling block 112 portion and the heater portion 109 of the fabricated piece 113, which may comprise an air gap 111 in some cases. There is a connection/direct coupling between the cooling block 112 and the heater portion 109 on the edges of the fabricated piece 113.

In an embodiment, the time taken for first level interconnect (FLI) structures of the die 116 to cool herein is reduced by about sixty percent when using a TCB tool incorporating the cooling solution 100 of the embodiments, as compared with prior art TCB/cooling solution tools, such as those employing plain jet cooling designs. Additionally, given the same or similar fluid pressures, the cooling solution 100 of the various embodiments exhibit about a 500 percent higher heat transfer coefficient and about a 100% higher flow rate than prior art cooling solutions. Thus, the cooling solution 100 therefore can operate at much lower fluid pressure and therefore reduce tool vibrations caused by cooling, and therefore can increase throughput from the TCB tool for such applications as 3D packages, large die, multi-chip packages incorporating central processing unit (CPU), with other devices.

Figure 1I:
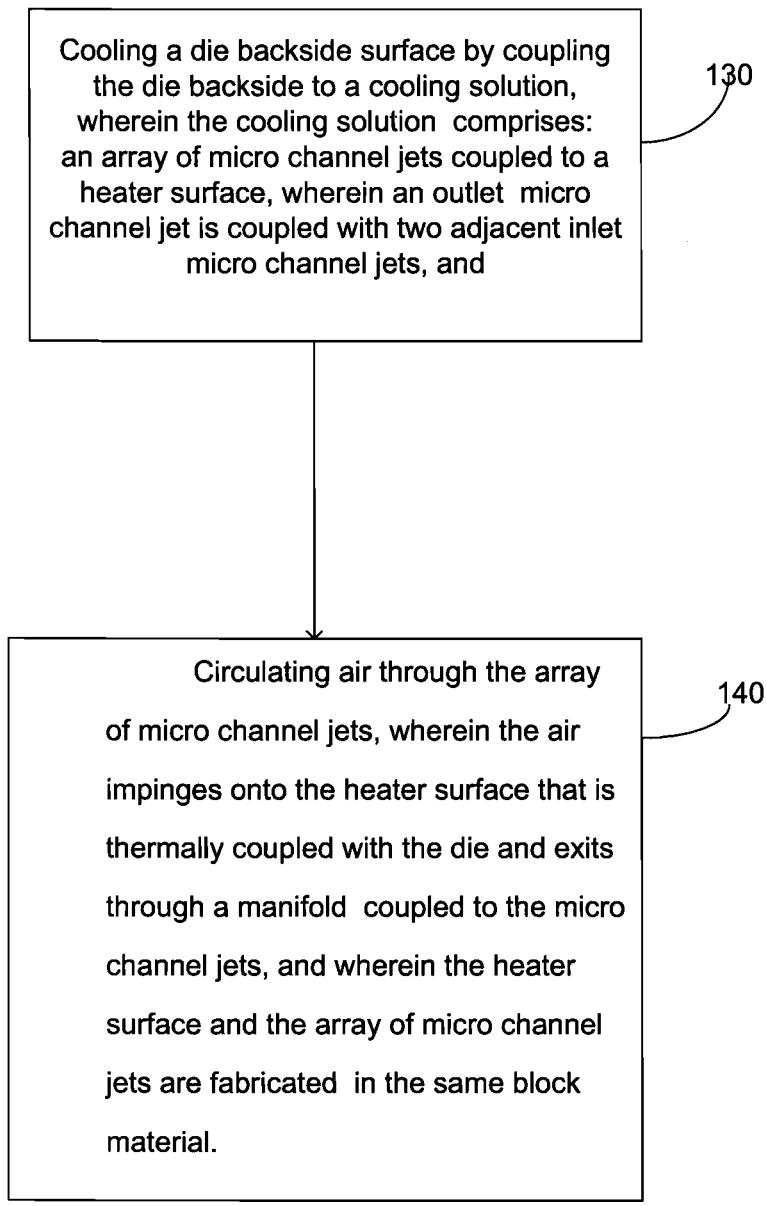
Figure 1J:
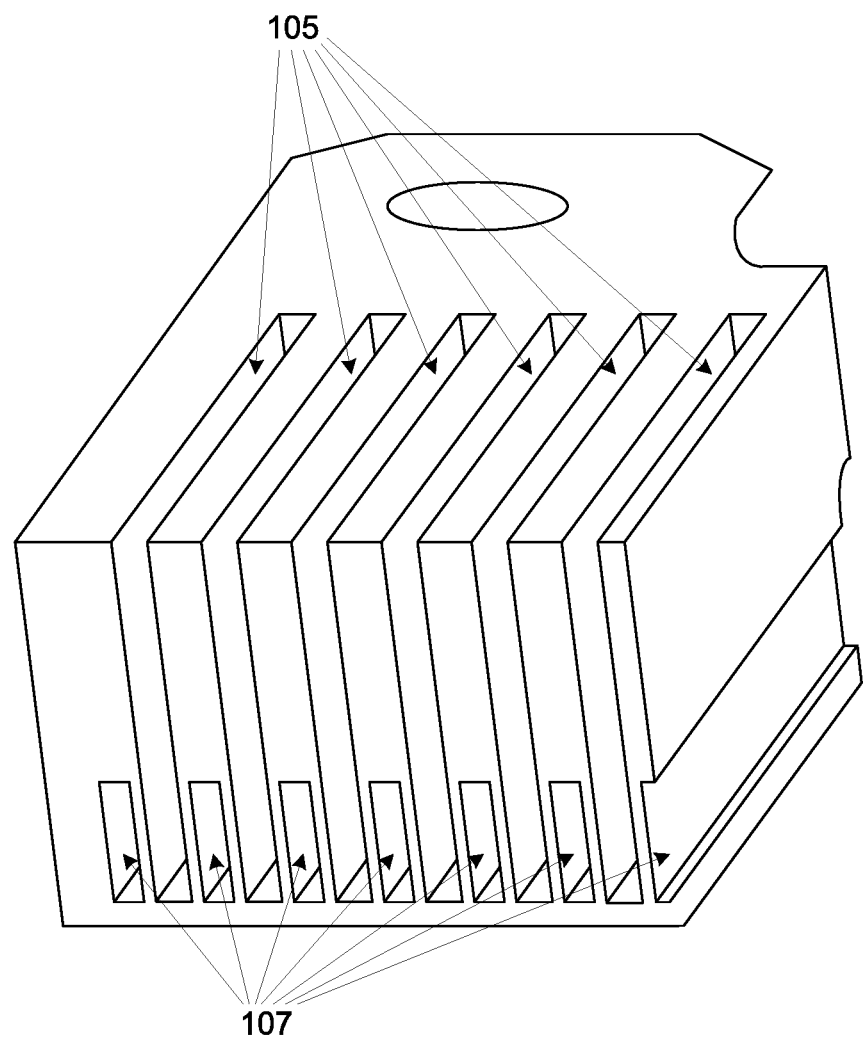

FIG. 1i depicts a method according to an embodiment. At step 130, a die backside surface may be cooled by coupling the die backside to a cooling solution, wherein the cooling solution comprises: an array of micro channel jets coupled to a heater surface, wherein an outlet micro channel jet is coupled with two adjacent inlet micro channel jets. At step 140, air may be circulated through the array of micro channel jets, wherein the air impinges onto the heater surface that is in thermal contact/is thermally coupled with the die and exits through a manifold coupled to the micro channel jets, wherein the heater surface and the array of micro channel jets are fabricated in the same block material.

Figure 1K:
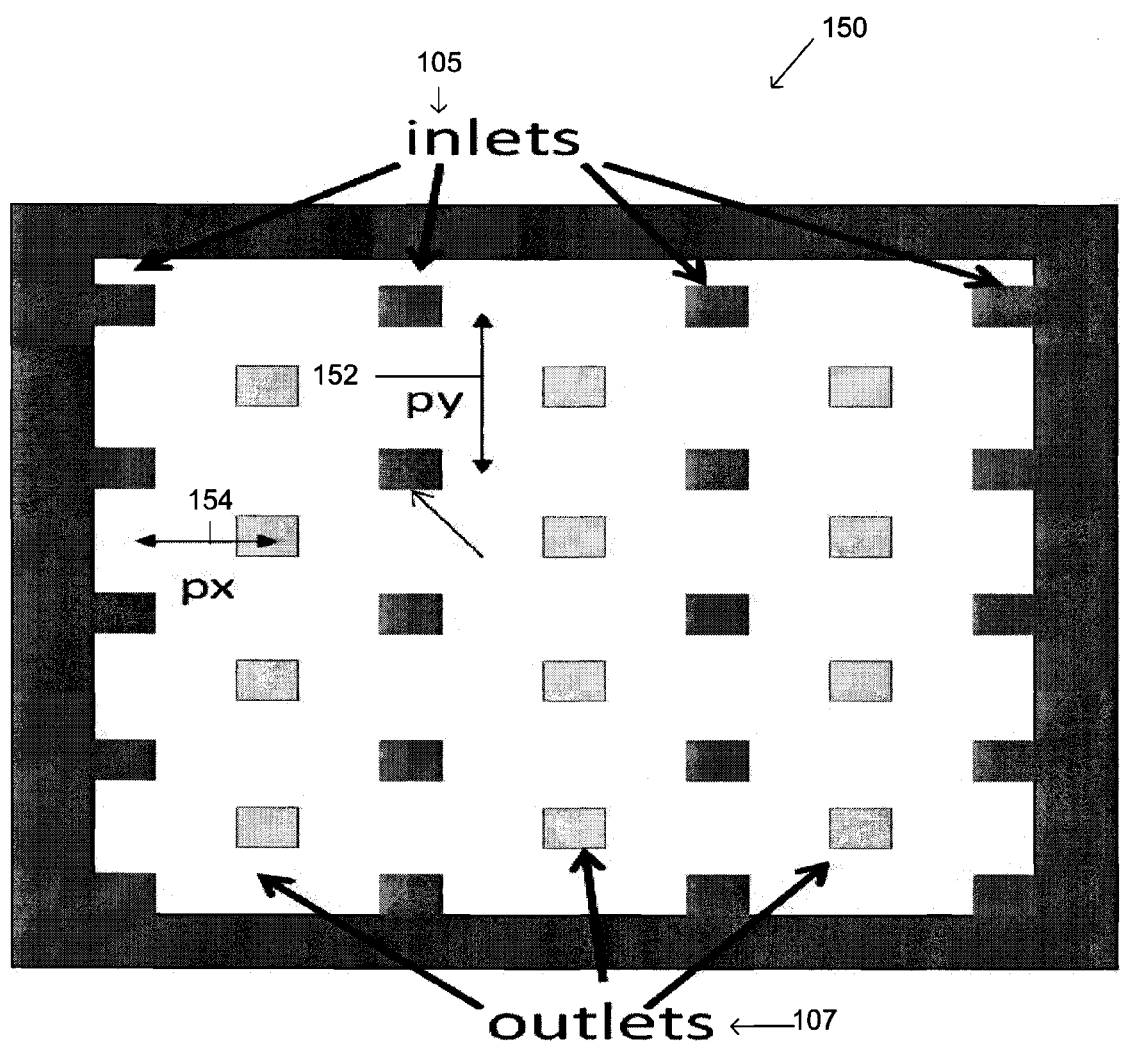
Figure 1I:
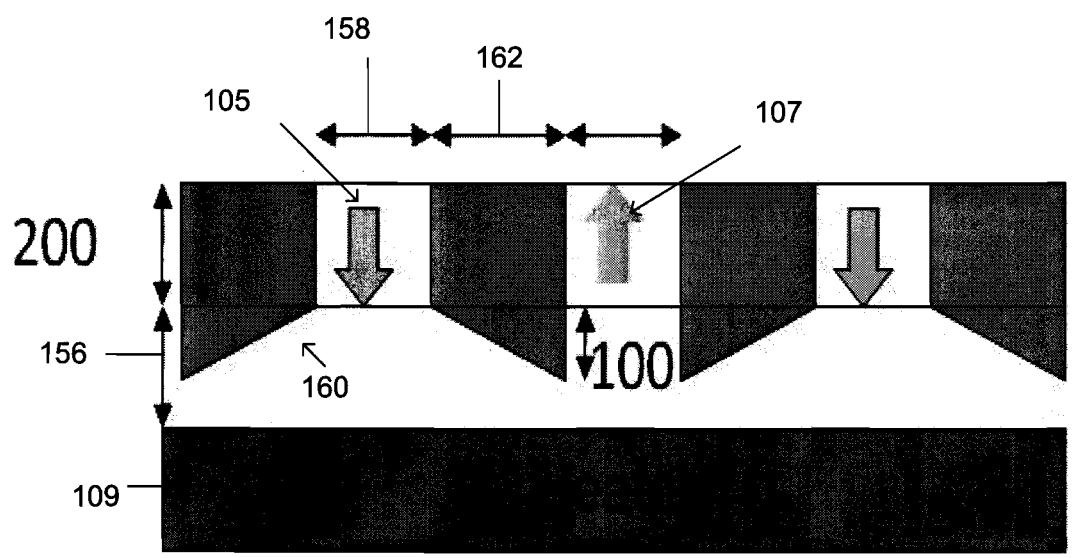

In another embodiment, FIG. 1k shows a bottom view of the an embodiment of a cooling solution, such as a direct air cooling solution 150. The cooling solution 150, which may comprise a portion of a TCB tool heater head design 150 in an embodiment, may comprise single rows of inlet micro channel jets 105 and outlet micro channel jets 107 with a staggered arrangement. In some cases, a vertical pitch 152 is twice as large as a horizontal pitch 154, that is, Py=2px. In one embodiment, the inlet and outlet openings may be made as small as possible. In some cases, a 200 um jet opening size may be used.

In an embodiment, a bottom portion 160 of the cooling solution 150 may be chamfered (FIG. 1l), wherein the chamfered portion may follow flow lines from the inlet/outlet jets 105, 107 and wherein the chamfered portion may serve to reduce pressure drop of the cooling solution 150. In some cases, the spacing between jet inlets and the heater surface can be less than or equal to a diameter of the jet inlet openings. In this case, a gap height 156 may be equal to jetting hole diameter 158 of 200 microns, for example. In an embodiment, the spacing between inlet jets 105 and outlet jets 162 may be greater than the diameter 158 of the inlet jet. By adding chamfers, the recirculation zone of the cooling solution 150 is significantly reduced. Therefore heat transfer is enhanced.

Figure 1M:
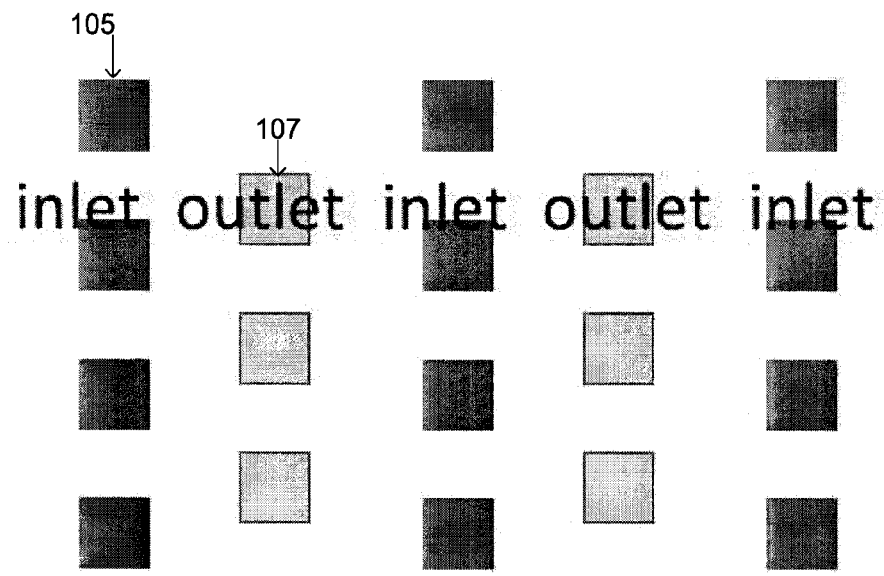
Figure 1N:
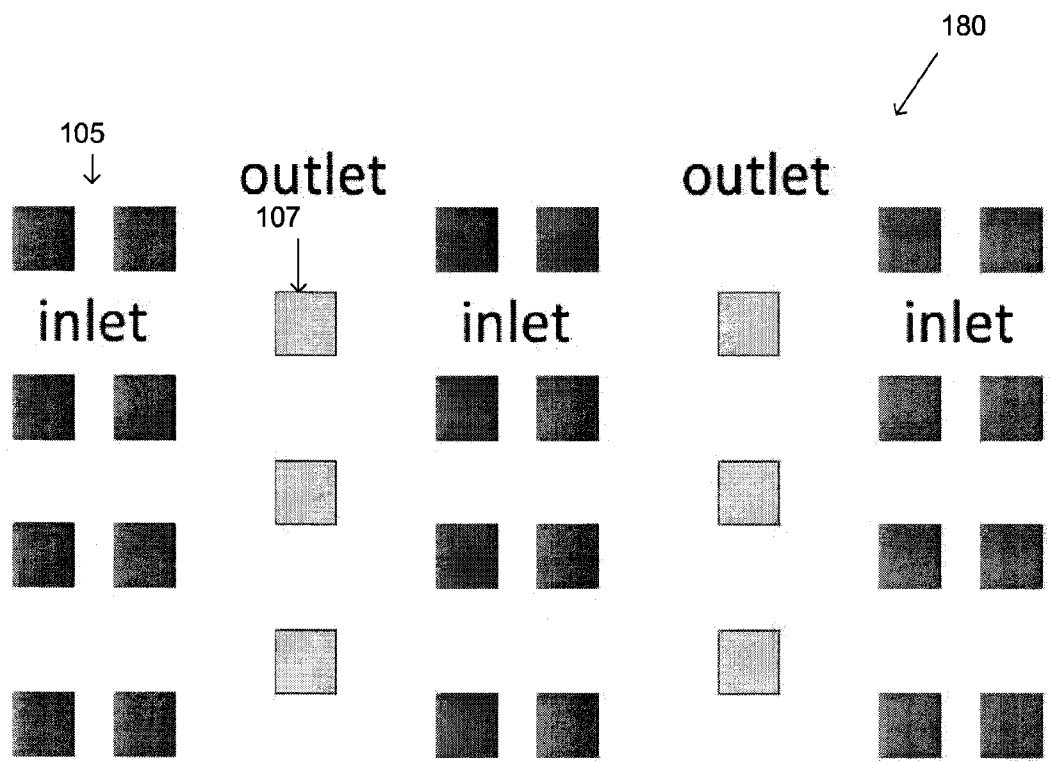

In another embodiment of a cooling solution 170, double rows of inlet jets 105 may be used (FIG. 1m, bottom view). In another embodiment of a cooling solution 180, the horizontal spacing may be increased between inlet 105 and outlet jets 107, and the unicell arrangements become rectangular (FIG. 1n). Both designs in FIGS. 1m-1n may have chamfered bottom portions of the cooling block. Both designs increase horizontal spacing with the same number of jetting holes for ease of manufacturing. Both designs may have rectangular, square, circular or other shapes of jetting holes.

Prior art thermal compression bonding (TCB) tools using active cooling solutions have slower cooling rates. Embodiments herein can achieve heat transfer coefficient much greater and comprise at least three times faster transient cooling rates as compared with prior art cooling solutions, and thus greatly reduce solder joint solidification times.

Although the foregoing description has specified certain steps and materials that may be used in the assemblies of the embodiments herein, those skilled in the art will appreciate that many modifications and substitutions may be made. Accordingly, it is intended that all such modifications, alterations, substitutions and additions be considered to fall within the spirit and scope of the invention as defined by the appended claims. In addition, the Figures provided herein may illustrate only portions of an exemplary microelectronic devices that pertain to the practice of the various embodiments. Thus the embodiments are not limited to the structures/assemblies described herein.

What is claimed is:

1. An assembly comprising:
a cooling block comprising an array of vertical micro channel jets coupled to a heater surface, wherein an outlet micro channel jet of the array is coupled with an adjacent inlet micro channel jet of the array; and
an inlet and outlet manifold coupled to the array of vertical micro channel jets, wherein the heater surface and the array of vertical micro channel jets are coupled in the same block material, wherein the heater surface comprises a plurality of micro fins, and wherein a tip of each micro fin is aligned in a center position between adjacent inlet and outlet micro channel jets.

2. The assembly of claim 1, wherein each outlet micro channel jet is coupled with two adjacent micro channel jets.

3. The assembly of claim 1, wherein inlet and outlet micro channel jets are disposed in a staggered configuration.

4. The assembly of claim 1, wherein a bottom portion of each inlet and outlet micro channel jet is chamfered.

5. The assembly of claim 1, wherein the vertical micro channel jets comprise vertical individual inlet and outlet nozzles attached to the heater surface.

6. The assembly of claim 1, further comprises a nozzle coupled to the heater, and a die coupled to the nozzle, wherein the die is on a substrate disposed on a pedestal.

7. The assembly of claim 5, wherein the assembly comprises a portion of a TCB bonding system.

8. The assembly of claim 1, wherein a TEC pad is disposed between the heater surface and the cooling block of the assembly.

* * * * *